United States Patent
Freidhof (10) Patent No.: US 10,775,417 B2
(45) Date of Patent: Sep. 15, 2020

(54) OSCILLOSCOPE AND METHOD

(71) Applicant: Rohde & Schwarz GmbH & Co. KG, Munich (DE)

(72) Inventor: Markus Freidhof, Kirchseeon (DE)

(73) Assignee: ROHDE & SCHWARZ GMBH & CO. KG, Munich (DE)

(*) Notice: Subject to any disclaimer, the term of this patent is extended or adjusted under 35 U.S.C. 154(b) by 244 days.

(21) Appl. No.: 15/716,951

(22) Filed: Sep. 27, 2017

(65) Prior Publication Data
US 2019/0094271 A1    Mar. 28, 2019

(51) Int. Cl.
  *G06F 11/30* (2006.01)
  *G01R 13/02* (2006.01)
  *H03M 1/12* (2006.01)
  *G01R 31/319* (2006.01)
  *G01R 31/3167* (2006.01)

(52) U.S. Cl.
  CPC ......... *G01R 13/0254* (2013.01); *G01R 13/02* (2013.01); *G01R 31/31919* (2013.01); *H03M 1/12* (2013.01); *G01R 31/3167* (2013.01); *H03M 1/123* (2013.01)

(58) Field of Classification Search
  CPC .................................................. G01R 13/0254
  See application file for complete search history.

(56) References Cited

U.S. PATENT DOCUMENTS

| | | | | |
|---|---|---|---|---|
| 5,590,349 A | * | 12/1996 | Robinson | .................. G06F 9/38 700/182 |
| 2012/0197598 A1 | | 8/2012 | Dobyns et al. | |
| 2012/0263101 A1 | | 10/2012 | Weller | |
| 2013/0182753 A1 | * | 7/2013 | Delforce | ............ H04B 17/0085 375/228 |

OTHER PUBLICATIONS

Keysight Technologies, "Keysight Trueform Series Waveform Generator", Operating and Service Guide, Edition 3, dated Sep. 2015, 592 pages.

* cited by examiner

*Primary Examiner* — Phuong Huynh
(74) *Attorney, Agent, or Firm* — Westman, Champlin & Koehler, P.A.

(57) ABSTRACT

An oscilloscope comprises a number of analog signal inputs for receiving respective analog input signals, an analog-to-digital converter, ADC, for every analog signal input, each ADC comprising an analog input and a digital output, the analog inputs being coupled to the respective one of the analog signal inputs for receiving the respective analog input signal, and the digital outputs outputting respective digital signals, and a signal processor coupled to the digital outputs of the ADCs that performs predetermined signal processing functions based on at least one of the digital signals and outputs a number of respective digital output signals.

18 Claims, 4 Drawing Sheets

OSCILLOSCOPE AND METHOD

TECHNICAL FIELD

The present invention relates to an oscilloscope. The present invention further relates to a method for operating an oscilloscope.

BACKGROUND

Although applicable in principle to any electronic system, the present invention and its underlying problem will be hereinafter described in combination with oscilloscopes.

In modern electrical engineering it is often necessary to record or measure electronic signals in a device under test. Further it may be necessary to generate electronic signals and provide them to a device under test.

Recording may e.g. be performed with oscilloscopes that are connected to a device under test and measure electronic signals, like e.g. voltages or currents, in the device under test.

Test signals that have to be provided to the device under test may e.g. be generated with function generators. Such function generators may e.g. be capable of generating signals with a number of predetermined waveforms at selectable frequencies. Such waveforms may e.g. be sine-waveforms, square-waveforms and triangle shaped waveforms.

However, such known setups offer only little flexibility.

Against this background, the problem addressed by the present invention is providing a signal measurement and generation system with increased flexibility.

SUMMARY

The present invention solves this objective problem by an oscilloscope with the features of the claimed invention and by a method for operating said oscilloscope.

Accordingly it is provided:

An oscilloscope, the oscilloscope comprising a number, i.e. one or more, of analog signal inputs for receiving respective analog input signals, an analog-to-digital converter, ADC, for every analog signal input, each ADC comprising an analog input and a digital output, the analog inputs being coupled to the respective one of the analog signal inputs for receiving the respective analog input signal, and the digital outputs outputting respective digital signals, a signal processor coupled to the digital outputs of the ADCs that performs predetermined signal processing functions based on at least one of the digital signals and outputs a number, i.e. one or more, of respective digital output signals.

Further, it is provided:

A method for operating an oscilloscope, the method comprising receiving a number of analog input signals via respective analog signal inputs, converting the received analog input signals into digital signals, each with an analog-to-digital converter, ADC, each ADC comprising an analog input and a digital output, the analog inputs being coupled to the respective one of the analog signal inputs for receiving the respective analog input signal, and the digital outputs outputting respective digital signals, and performing predetermined signal processing functions based on at least one of the digital signals and outputting a number of respective digital output signals with a signal processor coupled to the digital outputs of the ADCs.

The present invention is based on the finding that modern oscilloscopes comprise signal acquisition components for acquiring signals. However, usually the acquired signals are only displayed to a user.

The present invention now takes advantage of the signal acquisition components that an oscilloscope may comprise and combines these signal acquisition components with the ability to modify the acquired signals and generate digital output signals based on the acquired signals.

To this end the present invention provides an oscilloscope with a number of analog signal inputs. These analog signal inputs may be coupled to electronic devices for receiving analog input signals from the electronic devices. It is understood, that respective probes may be used to couple the analog signal inputs to the electronic devices.

In addition, analog-to-digital converters, ADCs, are also provided. The ADCs are coupled to analog signal inputs and convert the analog input signals into digital signals. The digital signals are then provided to the signal processor. The signal processor may then perform signal processing functions with or on the digital signals and output respective digital output signals.

It is understood, that the oscilloscope may comprise respective digital signal outputs or output terminals. Via such outputs or terminals the digital output signals may then e.g. be provided to electronic devices as input signals.

It is understood, that the analog signal inputs may comprise a plug or receptacle for attaching probes or cables. In addition, the analog signal inputs may further comprise analog signal conditioning circuitry, like e.g. impedance matching circuits, filters, amplifiers, attenuators or the like, that condition the incoming analog signals prior to forwarding them to the ADCs.

The ADCs may be any type of ADCs that are adequate for converting the analog input signals into digital signals. Such ADCs may e.g. comprise sample rates up to several GHz and input bandwidths also of several GHz. The digital outputs of such ADCs may e.g. be parallel digital outputs with a bandwidth of 8 bit, 16 bit, 32 bit or any other adequate number of bits. Serial digital outputs may also be provided.

It is understood, that the signal processor will comprise a respective interface to couple to the digital outputs of the ADCs, i.e. a respective digital parallel or serial interface.

As indicated above, the digital output signals may be generated by the digital signal processor and may be provided to an electronic device as input signal.

It is further understood, that the ADCs may also in parallel to the signal processor be coupled to further elements of the oscilloscope. The ADCs may e.g. be coupled to a signal acquisition and/or trigger logic of the oscilloscope that records the digital signals and prepares the signals for display to a user. It is understood, that the oscilloscope may also comprise storage means for storing the acquired signals.

The present invention therefore allows using the input signal chain of the oscilloscope not only for acquiring analog signals. Instead, with the present invention it is possible to use the input signal chain of the oscilloscope to generate source signals for a following signal generation. The generated digital output signals may then be used e.g. as input signals in an electronic device under test.

Further embodiments of the present invention are subject of the further subclaims and of the following description, referring to the drawings.

In a possible embodiment, the signal processor may comprise a signal processing logic that performs the predetermined signal processing functions.

The signal processor may e.g. be a processor that comprises signal input interfaces, like e.g. parallel or serial signal input interfaces. The signal input interfaces may be coupled to the signal processing logic to provide digital signals to the signal processing logic. The signal processing logic may e.g. comprise or perform different signal processing functions that may use the provided digital signals as input signals and/or as trigger signals. This means that provided digital signals may e.g. trigger the execution of signal processing functions. For example either specific signal values or a change of a signal level may be the trigger.

If the provided digital signals form the input signals of the signal processing functions, this may e.g. mean that the provided digital signals may directly be processed or modified. As alternative or in addition, the provided digital signals may also be used as modification signals for other signals that the signal processing logic may e.g. generate internally. The digital signals may e.g. be used as modulation signals or the like.

It is understood, that the signal processing logic may e.g. be implemented as a microcontroller with a respective firmware. Such a microcontroller may comprise respective signal input interfaces that are coupled to a processing core that executes instructions of a firmware to implement the functions of the signal processing logic. As an alternative or in addition, the signal processor may e.g. be implemented on a FPGA or CPLD with respective signal input interfaces.

In a possible embodiment, the signal processing logic may comprise at least one of a filter, especially a low pass filter or a high pass filter, and/or a demodulator, especially an I/Q demodulator and/or an AM demodulator and/or a FM/PM demodulator, and/or a down converter.

Providing the signal processing logic with several additional modules or elements allows performing a plurality of different signal processing functions based on the incoming digital signals. The filters may e.g. be high pass, low pass or band pass filters that allow separating specific signal parts from the incoming digital signals for further processing. Further, demodulators and down converters may be provided to extract signal content from modulated signals. A down converter may e.g. convert a signal from a transmission frequency range to the frequency range of the original signal.

It is understood, that these elements may be provided as software or firmware functions implemented by respective executable instructions. It is however understood, that these elements may also be implemented in hardware, e.g. as functional blocks on an FPGA. Further, it is possible for a control block in such an FPGA to interconnect different elements into a functional chain. A respective switching matrix may e.g. be implemented in the FPGA that allows forming a signal chain from the signal input interfaces via different ones of the functional elements to respective signal outputs.

With the functional elements implemented in an FPGA, CPLD or ASIC the respective functions may be implemented in real-time.

In a possible embodiment, the predetermined signal processing functions may comprise modulation functions and/or down conversion functions and/or signal modification functions and/or signal decoding functions.

As already indicated above, the functions of the signal processing logic may be implemented in an FPGA as hardware elements. It is however understood, that the modulation functions and/or down conversion functions and/or signal modification functions and/or signal decoding functions may also be implemented as computer executable instructions in a software or firmware.

This allows executing the signal processing functions in any processor, e.g. of a microcontroller, a digital signal processor or the like. The speed of execution of the signal processing function depends on the speed of the processor. Especially with dedicated processors, like digital signal processors, the speed of execution may be optimized.

Especially with FPGAs, CPLDs or DSPs a real time signal processing may be provided. The term "real time" in this case refers to the signals being generated such that the generated signals are accepted by the device under test as genuine signals and that the duration of the signal processing does not cause an error in the device under test.

In a possible embodiment, the signal processing logic may comprise a bus decoder that decodes the digital signals according to a predefined bus protocol and provides respective decoded signals for performing at least one of the predetermined signal processing functions.

The term bus decoder may refer to any device that may receive analog signals that may be transmitted on and recorded from a digital data bus. The bus decoder may then analyze the signals to determine, i.e. decode, the data that is transmitted on the data bus. This e.g. allows using actual content of such a digital data bus as sole or additional input for the signal processor.

The signal processor may then e.g. perform modifications of the decoded signals and output the modified decoded signals as part of the digital output signals.

The bus decoder further allows combining analog input signals with the decoded digital signals. This means that the analog input signals may e.g. be used as triggers for starting a modification of the decoded signals or vice versa. Further, the content of the decoded signals may be amended according to the analog input signals.

The bus decoder may e.g. decode $I^2C$ bus signals and the signal processor may then manipulate the content, e.g. with a respective manipulation logic. Manipulating the content may e.g. refer to directly changing bit values or to stripping headers or the like from the data. It is understood, that any other type of digital bus, like e.g. SPI, $I^2S$, USB, Firewire, Ethernet and the like may also be analyzed.

In a possible embodiment, the oscilloscope may comprise a number of digital inputs for receiving digital input signals, wherein the digital inputs are coupled to the signal processor for providing the digital input signals to the digital signal processor, wherein the digital signal processor generates the digital output signals based on the digital input signals.

The digital inputs are inputs that may receive digital signals. In contrast to the analog signal inputs, the digital signal inputs do not record or analyze analog waveforms. Instead, the digital inputs react to level changes of the digital signals and directly provide the digital values of the respective digital signals to the signal processor.

Further, the digital inputs may be combined with the bus decoder. This allows extracting the data from digital signals that are transmitted on the respective digital data bus without the need to reconstruct the digital signals from analog signals. Instead, the bus decoder may directly detect the digital signals and provide respective digital data to the signal processor.

Therefore, the effort for recording or picking-up the digital signals is greatly reduced.

In a possible embodiment, the signal processor may comprise an arbitrary waveform generator that is coupled to the ADCs and generates the digital output signals based on the digital signals.

An arbitrary waveform generator may generate an arbitrary waveform by sequentially reading the values for the arbitrary waveform from a memory. For example a signal generation logic may be coupled to a waveform memory and sequentially read values from that waveform memory and generate respective output signals.

Such an arbitrary waveform generator may e.g. comprise a signal input for receiving the digital signals that are generated by the ADCs. These digital signals represent the original analog input signals that are received in the oscilloscope via the analog signal inputs. The arbitrary waveform generator may use these signals as additional signals for generating the output waveforms. The arbitrary waveform generator may e.g. use these signals as modulation signals or as trigger signals.

Especially in combination with the bus decoder, the arbitrary waveform generator may perform signal manipulation and generation. The resulting signals may then e.g. be injected into the respective digital bus.

In a possible embodiment, the oscilloscope may comprise for every digital output signal a digital-to-analog converter, DAC, coupled to the signal processor, wherein the DACs convert the respective digital output signals into respective analog output signals.

With the help of the DAC it is possible to generate not only digital output signals but also analog output signals. The analog output signals may be generated by the DACs based on the digital output signals generated by the signal processor.

In a testing or measurement scenario it may e.g. be necessary to generate a modulated signal that comprises a specific content based on an analog input signal. In such a scenario the analog input signal may e.g. be received via the analog signal inputs and may be provided to the signal processor, e.g. the arbitrary waveform generator or another signal processing element that uses the signal as a modulation signal. The arbitrary waveform generator may e.g. modulate a waveform that is stored in a waveform memory or generated by a function generator based on the signal received from the ADCs or vice versa.

In addition, the arbitrary waveform generator may e.g. comprise digital inputs or may use digital inputs of the oscilloscope to receive digital signals. The arbitrary waveform generator may then e.g. modulate the signals received via the digital inputs based on an analog signal received via the analog signal inputs and provide a respective digital output signal.

The digital output signal may then e.g. be provided to an RF unit of an electronic device to test the RF unit. The signals generated by the RF unit may then at the same time be recorded with one of the analog signal inputs of the oscilloscope e.g. for review by a user or the like.

In a possible embodiment, the oscilloscope may comprise a sampling rate converter that is coupled between the ADCs and the DACs and that converts a sampling rate of the digital signals to a sampling rate of the DACs.

It is understood, that the sampling rate converter may e.g. be provided between the ADCs and the signal processor or inside of the signal processor, e.g. before the arbitrary waveform generator or between the signal processor and the DACs.

With the present invention it is possible to low-pass filter an analog signal received via the analog signal inputs and use the signal e.g. as a modulation signal for an amplitude or frequency modulation with the arbitrary waveform generator.

In another exemplary application, a modulated signal may be received via the analog signal inputs and may be demodulated in the signal processor e.g. with a demodulator. The demodulated signal may then be provided to the arbitrary waveform generator. Especially with an arbitrary waveform generator that comprises multiple outputs for example in-phase and quadrature signals (I/Q) may be output separately.

In combination with a bus decoder the numerical data transmitted on a data bus may e.g. be converted into analog signals with a DAC or the arbitrary waveform generator. This may also include decoding complex bus protocols, like e.g. SENT, USB, CAN, FlexRay or the like. As alternative the data may be used as a parameter for signal generation by the arbitrary waveform generator, e.g. as frequency. Since on a data bus data may be transmitted in a plurality of logical channels, the data of the single channels may be extracted and may be treated separately. For example, the data of different channels may serve as modulation signal for different channels of the arbitrary waveform generator.

BRIEF DESCRIPTION OF THE DRAWINGS

For a more complete understanding of the present invention and advantages thereof, reference is now made to the following description taken in conjunction with the accompanying drawings. The invention is explained in more detail below using exemplary embodiments which are specified in the schematic figures of the drawings, in which.

The appended drawings are intended to provide further understanding of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown to scale.

In the drawings, like, functionally equivalent and identically operating elements, features and components are provided with like reference signs in each case, unless stated otherwise.

DETAILED DESCRIPTION OF THE DRAWINGS

Figure 1:
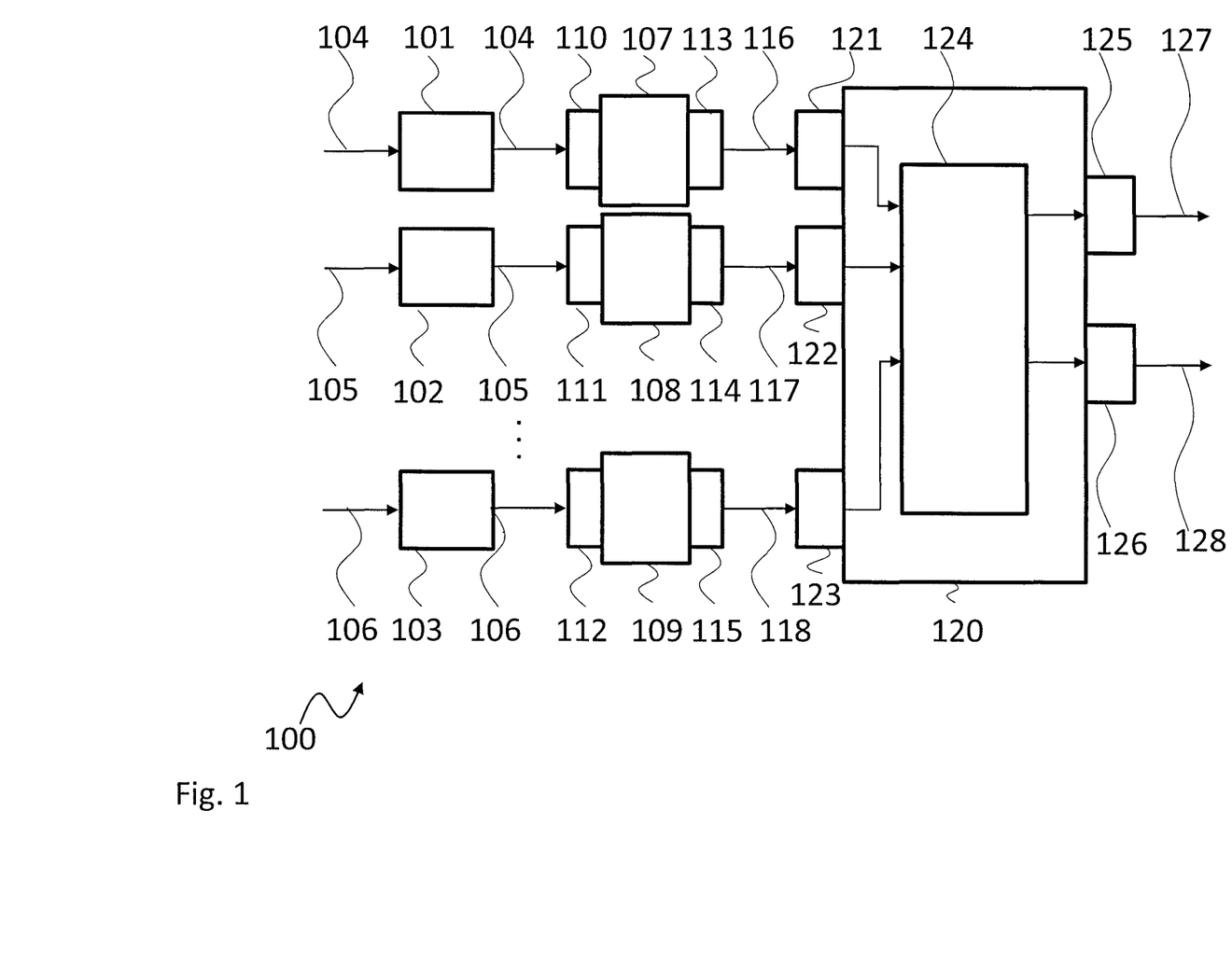
FIG. 1 shows a block diagram of an embodiment of an oscilloscope according to the present invention.

FIG. 1 shows a block diagram of an oscilloscope 100. The oscilloscope 100 comprises three exemplary analog signal inputs 101, 102, 103 for receiving analog input signals 104, 105, 106. It is understood, that the number of three analog signal inputs 101, 102, 103 is just exemplarily chosen and that more or less analog signal inputs 101, 102, 103 are possible.

The analog signal inputs 101, 102, 103 are each coupled to an ADC 107, 108, 109. Each one of the ADCs 107, 108, 109 comprises an analog input 110, 111, 112 and a digital output 113, 114, 115. The ADCs 107, 108, 109 convert the analog input signals 104, 105, 106 into digital signals 116, 117, 118.

The digital outputs 113, 114, 115 are each coupled to signal processor 120 via input ports 121, 122, 123 of the signal processor 120. In the signal processor 120 signal processing functions 124 are provided that perform signal processing on the digital signals 116, 117, 118. The signal processing functions 124 may e.g. comprise modulation functions and/or down conversion functions and/or signal modification functions and/or signal decoding functions. It is understood, that such functions may either be implemented in software, hardware or a combination of both, e.g. in a DSP, an ASIC or CPLD or a System-On-Chip, SOC, that comprises a programmable controller as well as a programmable logic section, e.g. an FPGA or CPLD section. In such an arrangement for example management tasks may be performed in the programmable controller while signal processing may be performed in the programmable logic section.

The processed digital signals 116, 117, 118 are then provided to the output ports 125, 126 as digital output signals 127, 128. It can be seen that the number of digital signals 116, 117, 118 needs not necessarily be equal to the number of output ports 125, 126. It is understood, that any number of output ports 125, 126 may be provided as required.

It is understood, that although not shown, the oscilloscope 100 may comprise a plurality of further elements, like e.g. a display for displaying the measured analog input signals 104, 105, 106 to a user, and a user interface for user interaction with the oscilloscope 100.

For sake of clarity in the following description of the method based figure the reference signs used in the description of apparatus based figures will be maintained.

Figure 2:
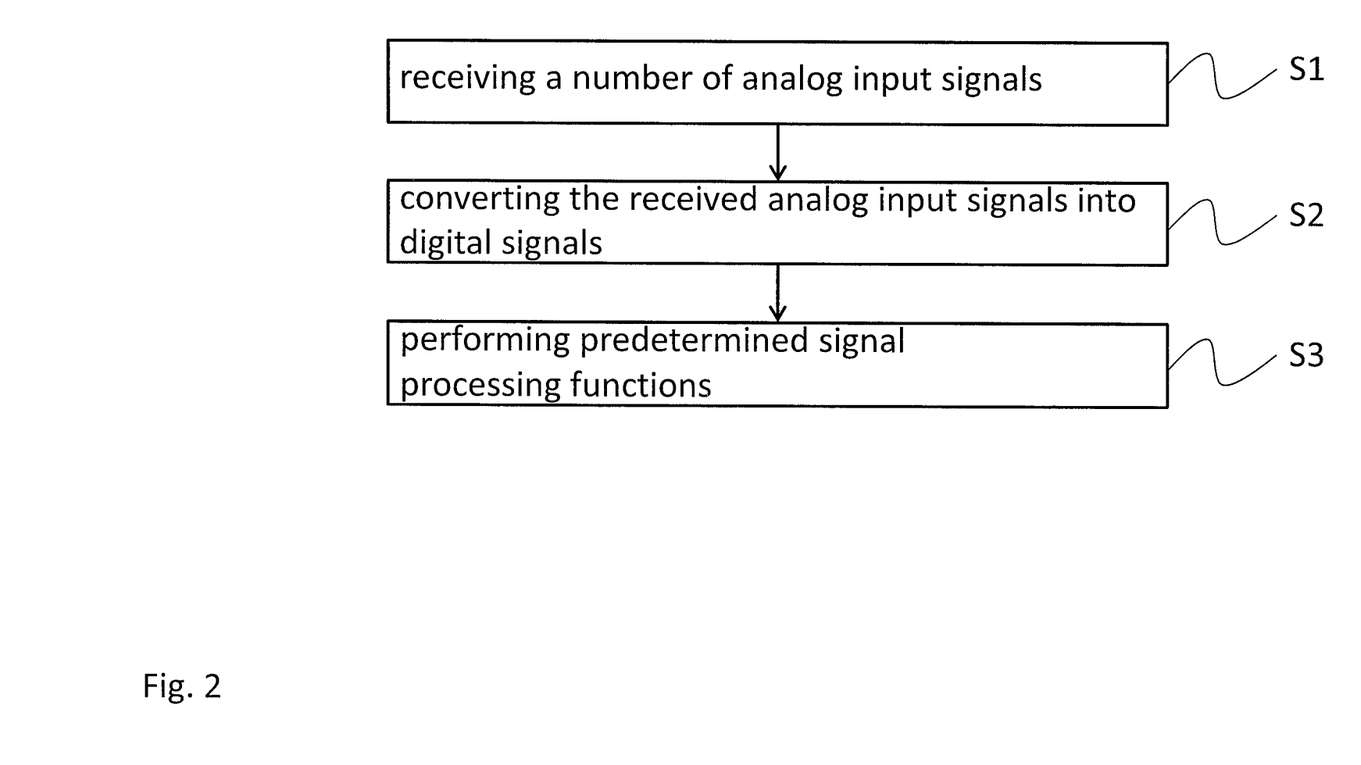
FIG. 2 shows a flow diagram of an embodiment of a method according to the present invention.

FIG. 2 shows a flow diagram of a method for operating an oscilloscope 100, 200, 300.

The method comprises receiving a number of analog input signals 104, 105, 106, 204, 205, 206, 304, 305, 306 via respective analog signal inputs 101, 102, 103, 201, 202, 203, 301, 302, 303, converting the received analog input signals 104, 105, 106, 204, 205, 206, 304, 305, 306 into digital signals 116, 117, 118, 216, 217, 218, 316, 317, 318, each with an analog-to-digital converter 107, 108, 109, 207, 208, 209, 307, 308, 309, ADC, each ADC comprising an analog input 110, 111, 112, 210, 211, 212, 310, 311, 312 and a digital output 113, 114, 115, 213, 214, 215, 313, 314, 315, the analog inputs 110, 111, 112, 210, 211, 212, 310, 311, 312 being coupled to the respective one of the analog signal inputs 101, 102, 103, 201, 202, 203, 301, 302, 303 for receiving the respective analog input signal 104, 105, 106, 204, 205, 206, 304, 305, 306, and the digital outputs 113, 114, 115, 213, 214, 215, 313, 314, 315 outputting respective digital signals 116, 117, 118, 216, 217, 218, 316, 317, 318, and performing predetermined signal processing functions 124 based on at least one of the digital signals 116, 117, 118, 216, 217, 218, 316, 317, 318 and outputting a number of respective digital output signals 127, 128, 227, 228, 327, 328 with a signal processor 120, 220, 320 coupled to the digital outputs 113, 114, 115, 213, 214, 215, 313, 314, 315 of the ADCs.

The predetermined signal processing functions 124 may e.g. be performed with a signal processing logic 230, 330 of the signal processor 120, 220, 320. The signal processing logic 230, 330 may e.g. comprise at least one of a filter 231, especially a low pass filter or a high pass filter, and/or a demodulator, especially an I/Q demodulator and/or an AM demodulator and/or a FM/PM demodulator, and/or a down converter.

The predetermined signal processing functions 124 that may be performed with the signal processing logic 230, 330 comprise modulation functions and/or down conversion functions and/or signal modification functions and/or signal decoding functions.

Performing predetermined signal processing functions 124 may e.g. comprise decoding the digital signals 116, 117, 118, 216, 217, 218, 316, 317, 318 according to a predefined bus protocol and providing respective decoded signals with a bus decoder 342 for performing at least one of the predetermined signal processing functions 124.

The method may further comprise receiving digital input signals 341 with a number of digital inputs 340. The digital inputs 340 may be coupled to the signal processor 120, 220, 320 for providing the digital input signals 341 to the digital signal processor 120, 220, 320, wherein the digital signal processor 120, 220, 320 generates the digital output signals 127, 128, 227, 228, 327, 328 based on the digital input signals 341.

The signal processor 120, 220, 320 may further comprise an arbitrary waveform generator 232, 332 that is coupled to the ADCs. The method may therefore comprise generating the digital output signals 127, 128, 227, 228, 327, 328 based on the digital signals 116, 117, 118, 216, 217, 218, 316, 317, 318 with the arbitrary waveform generator 232, 332.

The method may further comprise converting the digital output signals 127, 128, 227, 228, 327, 328 into respective analog output signals 236, 237, 336, 337 with a digital-to-analog converter 234, 235, 334, 335, DAC, coupled to the signal processor 120, 220, 320. In addition, the method may comprise converting a sampling rate of the digital signals 116, 117, 118, 216, 217, 218, 316, 317, 318 to a sampling rate of the DACs with a sampling rate converter 233, 333 that is coupled between the ADCs and the DACs.

Figure 3:
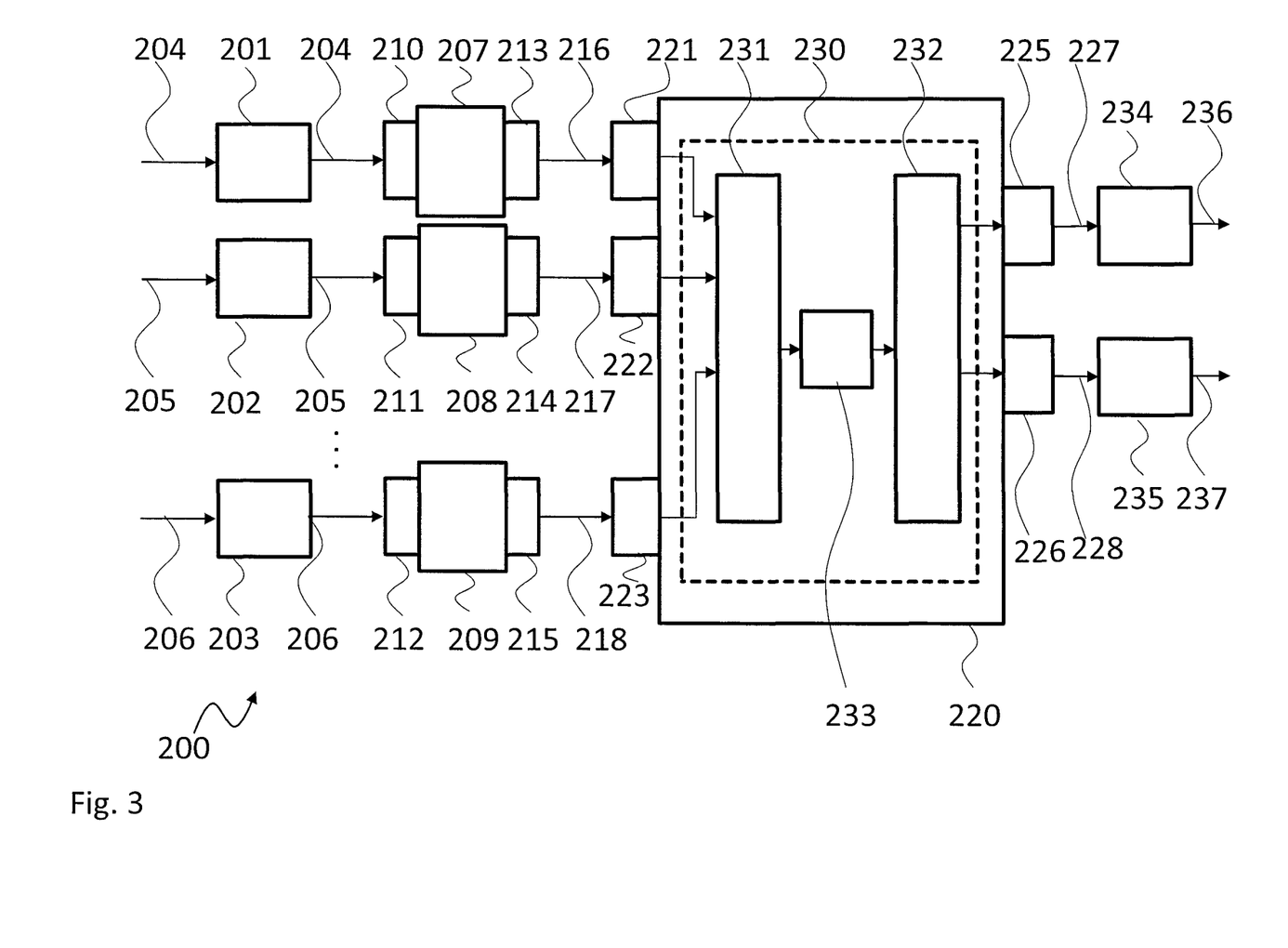
FIG. 3 shows a block diagram of another embodiment of an oscilloscope according to the present invention.

FIG. 3 shows a block diagram of another oscilloscope 200. The oscilloscope 200 is based on the oscilloscope 100 and therefore also comprises analog signal inputs 201, 202, 203 that receive analog input signals 204, 205, 206. The analog input signals 204, 205, 206 are then provided to ADCs 207, 208, 209, where they are converted into digital signals 216, 217, 218 for the signal processor 220.

The main difference between the oscilloscope 100 and the oscilloscope 200 lies in the signal processor 220 and the digital-to-analog converters, DACs, 234, 235 that are provided for the output signals 227, 228.

In the signal processor 220 a signal processing logic, in this case a filter 231, is provided that processes the digital signals 216, 217, 218. The processed digital signals 216, 217, 218 are then provided to a sampling rate converter 233 and then to an arbitrary waveform generator 232. The arbitrary waveform generator 232 provides digital output signals 227, 228 to the DACs 234, 235. The DACs 234, 235 then convert the digital output signals 227, 228 into analog output signals 236, 237.

It is understood, that instead of the filter 231 other functional elements may be provided. Such elements may e.g. include a demodulator, especially an I/Q demodulator and/or an AM demodulator and/or a FM/PM demodulator, a down converter or the like.

It is further understood, that the sampling rate converter 233 is an optional element and may only be needed, if the sampling rate of the digital signals 216, 217, 218 is different than the sampling rate of the arbitrary waveform generator 232 or the DACs 234, 235.

Figure 4:
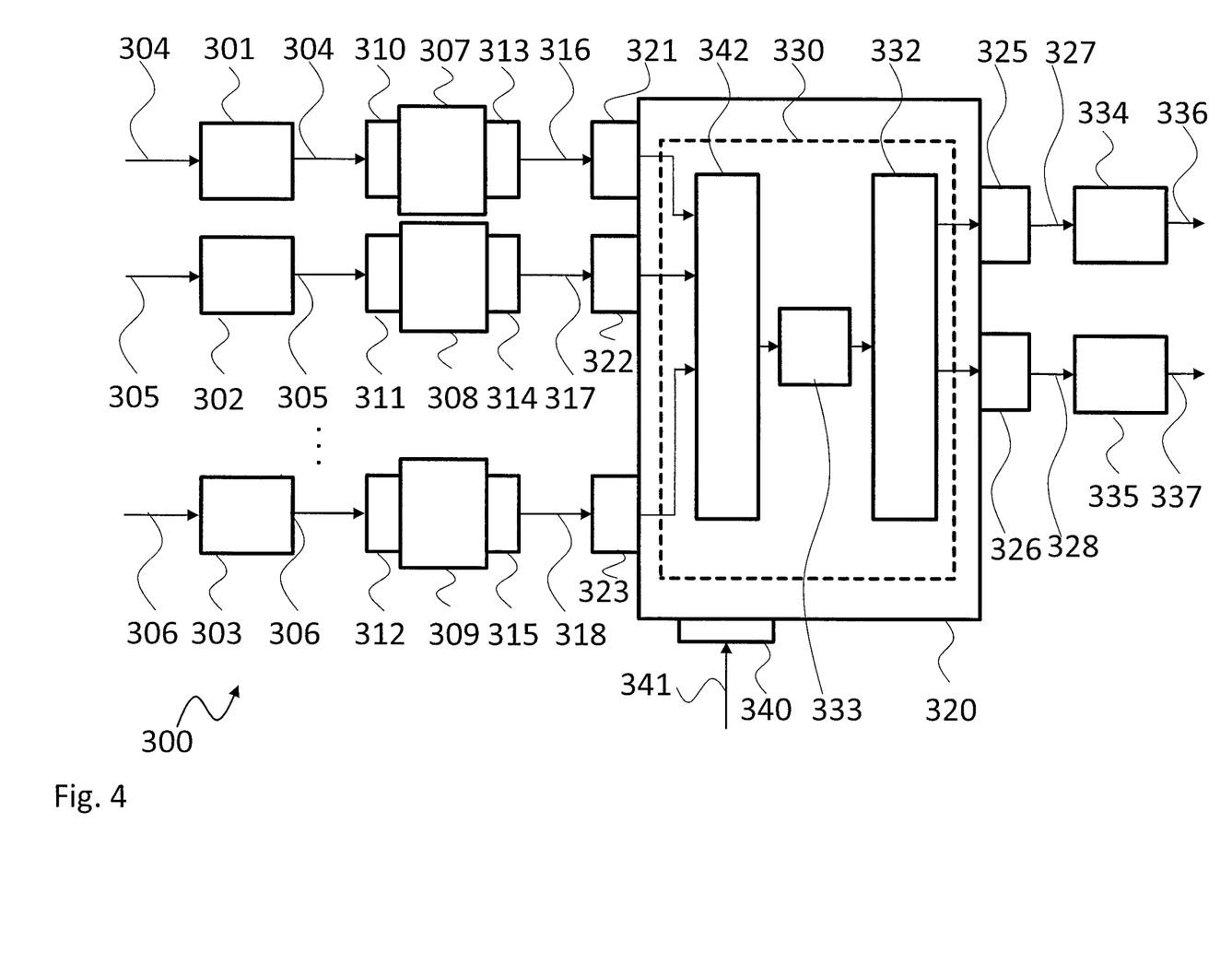
FIG. 4 shows a block diagram of another embodiment of an oscilloscope according to the present invention.

FIG. 4 shows a block diagram of another oscilloscope 300. The oscilloscope 300 is based on the oscilloscope 200. The oscilloscope 300 therefore also comprises analog signal inputs 301, 302, 303 that receive analog input signals 304, 305, 306. The analog input signals 304, 305, 306 are then provided to ADCs 307, 308, 309, where they are converted into digital signals 316, 317, 318 for the signal processor 320.

Instead of the filter 231, the oscilloscope 300 however comprises a bus decoder 342. Further, the signal processor 320 comprises a digital input 340 for receiving digital signals 341. The digital signals 341 may e.g. be digital signals 341 of a digital data bus, like e.g. a SPI bus, a I²C bus, a USB bus, a PCI bus, an Ethernet network or the like.

The bus decoder 342 may either be supplied with the digital signals 316, 317, 318 or with the digital signals 341 and may decode the respective signals for further processing in the arbitrary waveform generator 332.

It is understood, that although the oscilloscope 200 comprises the filter 231 and the oscilloscope 300 comprises the bus decoder 342, in another embodiment, the oscilloscope may comprise signal processing functions or elements like the filter 231 as well as the bus decoder 342. It is further understood, that the DACs 334, 335 are only optional.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

In the foregoing detailed description, various features are grouped together in one or more examples or examples for the purpose of streamlining the disclosure. It is understood that the above description is intended to be illustrative, and not restrictive. It is intended to cover all alternatives, modifications and equivalents as may be included within the scope of the invention. Many other examples will be apparent to one skilled in the art upon reviewing the above specification.

Specific nomenclature used in the foregoing specification is used to provide a thorough understanding of the invention. However, it will be apparent to one skilled in the art in light of the specification provided herein that the specific details are not required in order to practice the invention. Thus, the foregoing descriptions of specific embodiments of the present invention are presented for purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Throughout the specification, the terms "including" and "in which" are used as the plain-English equivalents of the respective terms "comprising" and "wherein," respectively. Moreover, the terms "first," "second," and "third," etc., are used merely as labels, and are not intended to impose numerical requirements on or to establish a certain ranking of importance of their objects.

| List of reference signs | |
|---|---|
| 100, 200, 300 | oscilloscope |
| 101, 102, 103 | analog signal input |
| 201, 202, 203 | analog signal input |
| 301, 302, 303 | analog signal input |
| 104, 105, 106 | analog input signal |
| 204, 205, 206 | analog input signal |
| 304, 305, 306 | analog input signal |
| 107, 108, 109 | analog-to-digital converter |
| 207, 208, 209 | analog-to-digital converter |
| 307, 308, 309 | analog-to-digital converter |
| 110, 111, 112 | analog input |
| 210, 211, 212 | analog input |
| 310, 311, 312 | analog input |
| 113, 114, 115 | digital output |
| 213, 214, 215 | digital output |
| 313, 314, 315 | digital output |
| 116, 117, 118 | digital signal |
| 216, 217, 218 | digital signal |
| 316, 317, 318 | digital signal |
| 120, 220, 320 | signal processor |
| 121, 122, 123 | input port |
| 221, 222, 223 | input port |
| 321, 322, 323 | input port |
| 124 | signal processing function |
| 125, 126 | output port |
| 225, 226 | output port |
| 325, 326 | output port |
| 127, 128 | digital output signal |
| 227, 228 | digital output signal |
| 327, 328 | digital output signal |
| 230, 330 | signal processing logic |
| 231 | filter |
| 232, 332 | arbitrary waveform generator |
| 233, 333 | sampling rate converter |
| 234, 235, 334, 335 | digital-to-analog converter |
| 236, 237, 336, 337 | analog output signal |
| 340 | digital input |
| 341 | digital input signal |
| 342 | bus decoder |
| S1, S2, S3 | method steps |

The invention claimed is:

1. An oscilloscope, the oscilloscope comprising:
a number of analog signal inputs for receiving respective analog input signals,
an analog-to-digital converter, ADC, for every analog signal input, each ADC comprising an analog input and a digital output, the analog inputs being coupled to the respective one of the analog signal inputs for receiving the respective analog input signal, and the digital outputs outputting respective digital signals, and
a signal processor coupled to the digital outputs of the ADCs that performs predetermined signal processing functions based on at least one of the digital signals and outputs a number of digital output signals,
wherein the number of digital output signals are based on the predetermined signal processing functions applied to the at least one of the digital signals.

2. The oscilloscope according to claim 1, wherein the signal processor comprises a signal processing logic that performs the predetermined signal processing functions.

3. The oscilloscope according to claim 2, wherein the signal processing logic comprises at least one of a filter, a demodulator or a down converter.

4. The oscilloscope according to claim 2, wherein the predetermined signal processing functions comprise at least one of modulation functions, and/or down conversion functions, signal modification functions or signal decoding functions.

5. The oscilloscope according to claim 2, wherein the signal processing logic comprises a bus decoder that decodes the digital signals according to a predefined bus protocol and provides respective decoded signals for performing at least one of the predetermined signal processing functions.

6. The oscilloscope according to claim 1, comprising a number of digital inputs for receiving digital input signals, wherein the digital inputs are coupled to the signal processor for providing the digital input signals to the digital signal processor, wherein the digital signal processor generates the digital output signals based on the digital input signals.

7. The oscilloscope according to claim 1, wherein the signal processor comprises an arbitrary waveform generator that is coupled to the ADCs and generates the digital output signals based on the digital signals.

8. The oscilloscope according to claim 1, comprising for every digital output signal a digital-to-analog converter, DAC, coupled to the signal processor, wherein the DACs convert the respective digital output signals into respective analog output signals.

9. The oscilloscope according to claim 8, comprising a sampling rate converter that is coupled between the ADCs and the DACs and that converts a sampling rate of the digital signals to a sampling rate of the DACs.

10. A method for operating an oscilloscope, the method comprising:
receiving a number of analog input signals via respective analog signal inputs,
converting the received analog input signals into digital signals, each with an analog-to-digital converter, ADC, each ADC comprising an analog input and a digital output, the analog inputs being coupled to the respective one of the analog signal inputs for receiving the respective analog input signal, and the digital outputs outputting respective digital signals, and
performing predetermined signal processing functions based on at least one of the digital signals and outputting a number of digital output signals with a signal processor coupled to the digital outputs of the ADCs, wherein the number of digital output signals are based on the predetermined signal processing functions applied to the at least one if the digital signals.

11. The method according to claim 10, wherein the predetermined signal processing functions are performed with a signal processing logic of the signal processor.

12. The method according to claim 11, wherein the signal processing logic comprises at least one of a filter, a demodulator or a down converter.

13. The method according to claim 11, wherein the predetermined signal processing functions comprise at least one of modulation functions, down conversion functions, signal modification functions or signal decoding functions.

14. The method according to claim 11, wherein performing predetermined signal processing functions comprises decoding the digital signals according to a predefined bus protocol and providing respective decoded signals with a bus decoder for performing at least one of the predetermined signal processing functions.

15. The method according to claim 10, comprising receiving digital input signals with a number of digital inputs, wherein the digital inputs are coupled to the signal processor for providing the digital input signals to the digital signal processor, wherein the digital signal processor generates the digital output signals based on the digital input signals.

16. The method according to claim 10, wherein the signal processor comprises an arbitrary waveform generator that is coupled to the ADCs and generates the digital output signals based on the digital signals.

17. The method according to claim 10, comprising converting the digital output signals into respective analog output signals with a digital-to-analog converter, DAC, coupled to the signal processor.

18. The method according to claim 17, comprising converting a sampling rate of the digital signals to a sampling rate of the DACs with a sampling rate converter that is coupled between the ADCs and the DACs.

* * * * *